(12) United States Patent
Jung et al.

(10) Patent No.: US 12,154,894 B2
(45) Date of Patent: Nov. 26, 2024

(54) DISPLAY DEVICE WITH DIVIDED CAPACITORS

(71) Applicant: LG Display Co., Ltd., Seoul (KR)

(72) Inventors: Wonjune Jung, Seoul (KR); Sangmoo Park, Goyang-si (KR); Haelim Jung, Seoul (KR)

(73) Assignee: LG DISPLAY CO., LTD., Seoul (KR)

( * ) Notice: Subject to any disclaimer, the term of this patent is extended or adjusted under 35 U.S.C. 154(b) by 417 days.

(21) Appl. No.: 17/459,650

(22) Filed: Aug. 27, 2021

(65) Prior Publication Data

US 2022/0068909 A1 Mar. 3, 2022

(30) Foreign Application Priority Data

Sep. 1, 2020 (KR) .................. 10-2020-0110967

(51) Int. Cl.
*H01L 27/02* (2006.01)
*H01L 27/12* (2006.01)
*H10K 59/126* (2023.01)

(52) U.S. Cl.
CPC ...... *H01L 27/0288* (2013.01); *H01L 27/0266* (2013.01); *H01L 27/0292* (2013.01); *H01L 27/0296* (2013.01); *H01L 27/1237* (2013.01); *H10K 59/126* (2023.02)

(58) Field of Classification Search
CPC .................................................. H01L 27/0288
See application file for complete search history.

(56) References Cited

U.S. PATENT DOCUMENTS 9,871,062 B2 1/2018 Im et al.
2020/0133083 A1* 4/2020 Chun ................ G02F 1/136213

FOREIGN PATENT DOCUMENTS

KR 10-2016-0125598 A 11/2016

\* cited by examiner

*Primary Examiner* — Tucker J Wright
(74) *Attorney, Agent, or Firm* — Birch, Stewart, Kolasch & Birch, LLP

(57) ABSTRACT

Discussed is a GIP-type display device having a bridge line that connects two neighboring divided capacitors with each other in a capacitor area such that leakage does not occur in the capacitor area in a non-display area when supplying a scan signal or a sensing signal to a thin-film transistor. Further, a method for manufacturing the same is discussed. To this end, a light-blocking film is disposed on a substrate, a buffer and gate insulating film is disposed on the light-blocking film, a gate metal film is disposed on the buffer and gate insulating film, an interlayer insulating film is disposed on the gate metal film, and a source and drain metal film is disposed on the interlayer insulating film, and the source and drain metal film forms the bridge line connecting the two neighboring divided capacitors with each other.

10 Claims, 9 Drawing Sheets

[ CAPACITOR AREA ]

[ TRANSISTOR AREA ]

$d = 6.0 \ \mu m$

DISPLAY DEVICE WITH DIVIDED CAPACITORS

CROSS-REFERENCE TO RELATED APPLICATION

This application claims a priority benefit under 35 U.S.C. § 119(a) to Korean Patent Application No. 10-2020-0110967 filed on Sep. 1, 2020, in the Korean Intellectual Property Office, the entire contents of which are incorporated herein by reference for all purposes into the present application.

BACKGROUND

Field

The present disclosure relates to a display device and a method for manufacturing the same that can connect two divided capacitors with each other through a bridge line in a capacitor area including at least one or more divided capacitors in a gate-driver in panel (GIP)-type display device.

Description of Related Art

A GIP-type display device uses a method of directly forming a gate drive circuit in a non-display area of a display panel.

Compared to a tape automated bonding (TAB) method, the GIP method has advantages in that not only external aesthetics can be improved, but also cost can be reduced because the display device is able to become slimmer, and a display panel maker can directly design a number of scan signals for compensating for a threshold voltage of a driving thin film transistor (TFT) of a pixel. Therefore, recently, a gate driving circuit is formed in the GIP method, rather than the TAB method.

A transistor area and a capacitor area are disposed in the non-display area of the GIP-type display device. The transistor area includes a switching thin-film transistor Tsw and a sensing thin-film transistor Tss. The capacitor area includes at least one or more divided capacitors for maintaining power supplied to such transistor area.

Therefore, the GIP-type display device maintains, through the capacitor area, constant power needed when providing a scan signal through the switching thin-film transistor Tsw or providing a sensing signal through the sensing thin-film transistor Tss.

SUMMARY OF THE INVENTION

In the capacitor area of a GIP-type display device, one of the divided capacitors includes a source/drain (S/D) metal corresponding to a first electrode and a gate metal corresponding to a second electrode, and the S/D metal and the gate metal form the capacitor with an insulating layer interposed therebetween.

In the capacitor area, two neighboring divided capacitors are connected to each other through a bridge line, and the bridge line is formed by extending from the S/D metal of one divided capacitor to the S/D metal of another divided capacitor.

In the bridge line, the S/D metal is located at an upper layer and the gate metal is located at a lower layer with the insulating layer interposed therebetween. However, there is a problem that fine leakage can occur during power supply due to the lack of an overlay margin between the two metal layers and an influence of step structure at a lower portion.

Further, there is a problem that a voltage drop can occur at a GIP charging node during a sensing operation using a sensing thin-film transistor, resulting in output noise.

Accordingly, in order to address the above-described problems and other issues, the inventors of the present disclosure invented a display device configured such that, for a bridge line BL that connects the divided capacitors with each other in a non-display area of the display device, an internal spacing between a source and drain electrode S/D extended from the first electrode and a gate metal extended from the second electrode of each divided capacitor is larger in a bent region of the source and drain electrode S/D than before.

Further, the inventors of the present disclosure have invented a method for manufacturing a display device for forming the display device in which, for the bridge line BL, the source and drain metal film S/D at the top layer connects the two divided capacitors with each other, the gate metal is inwardly formed on the buffer and the gate insulating film with the insulating layer interposed therebetween, the source and drain metal film S/D is connected to a drain electrode of each thin-film transistor, and the gate metal film is connected to a gate electrode of each thin-film transistor such that the display device has the above-described structure.

The purposes of the present disclosure described above are not limited to the purposes mentioned above. Other purposes and advantages of the present disclosure not mentioned can be understood by the description below, and will be more clearly understood by the embodiment of the present disclosure. Further, it will be easily understood that the purposes and advantages of the present disclosure can be realized by means and combinations thereof described in the claims.

A display device according to an embodiment of the present disclosure can be provided. The display device is formed such that, for a bridge line that connects neighboring divided capacitors with each other in a capacitor area including at least one more divided capacitors in a non-display area of a display panel, a source and drain electrode is formed at a top layer to connect two divided capacitors with each other, and a gate metal is inwardly located at a lower layer with an insulating layer interposed therebetween and is formed on a top face of a buffer and gate metal film to be spaced apart from the source and drain electrode by a certain spacing that does not cause leakage.

Further, a method for manufacturing a display device according to an embodiment of the present disclosure can be provided. The display device manufacturing method allows a light-blocking film LS to be formed on a top face of a substrate PL, allows a buffer and gate insulating film BF+GI to be formed on a top face of the light-blocking film, allows a gate metal film to be formed on a top face of the buffer and gate insulating film, allows an interlayer insulating film ILD to be formed on a top face of the gate metal film, and allows a source and drain metal film S/D to be formed on a top face of the interlayer insulating film as a process of forming a bridge line BL connecting two divided capacitors in a capacitor area in a non-display area of a display panel.

Further, in the display device and the method for manufacturing the same according to an embodiment of the present disclosure, the buffer and gate insulating film is formed to have a bent first region and a flat second region, and the gate metal film is formed on the top face of the buffer and gate insulating film and in the second region so as not to reach the first region.

According to the embodiment of the present disclosure, the source and drain metal film of the upper layer and the gate metal film of the lower layer internally maintain a constant spacing therebetween for the bridge line that connects the two divided capacitors in the non-display area in the GIP-type display device, thereby preventing the occurrence of the fine leakage when supplying power to each thin-film transistor.

Further, the present disclosure can prevent the generation of the output noise as the voltage drop does not occur because the charging operation of the divided capacitor is normal during the sensing operation of the thin-film transistors in the non-display area.

Further, according to the embodiment of the present disclosure, the bridge line that connects the two divided capacitors with each other in the non-display area is not affected by the interlayer overlay margin and the stepped structure at the lower portion, so that each divided capacitor operates normally to eliminate leakage current.

Further, according to the embodiment of the present disclosure, in a cross-sectional structure of the bridge line that connects the two divided capacitors with each other in the non-display area, there is the interlayer overlay margin of equal to or greater than 2 μm and equal to or less than 6 μm from an end of the light-blocking film to an end of the gate metal film, so that the fine leakage does not occur.

In addition, as the cross-sectional structure of the bridge line according to the present disclosure is applied to an electro static discharge (ESD) circuit, the occurrence of the fine leakage can also be prevented in a display device with the electrostatic discharge circuit.

The effects of the present disclosure are not limited to the effects mentioned above, and another effect not mentioned will be clearly understood by those skilled in the art from the following description.

In addition to the above-described effects, specific effects of the present disclosure will be described together while describing details for implementing the present disclosure below.

BRIEF DESCRIPTION OF DRAWINGS

The present disclosure will become more fully understood from the detailed description given hereinbelow and the accompanying drawings which are given by way of illustration only, and thus are not limitative of the present disclosure.

DETAILED DESCRIPTION OF THE EMBODIMENTS

Figure 1:
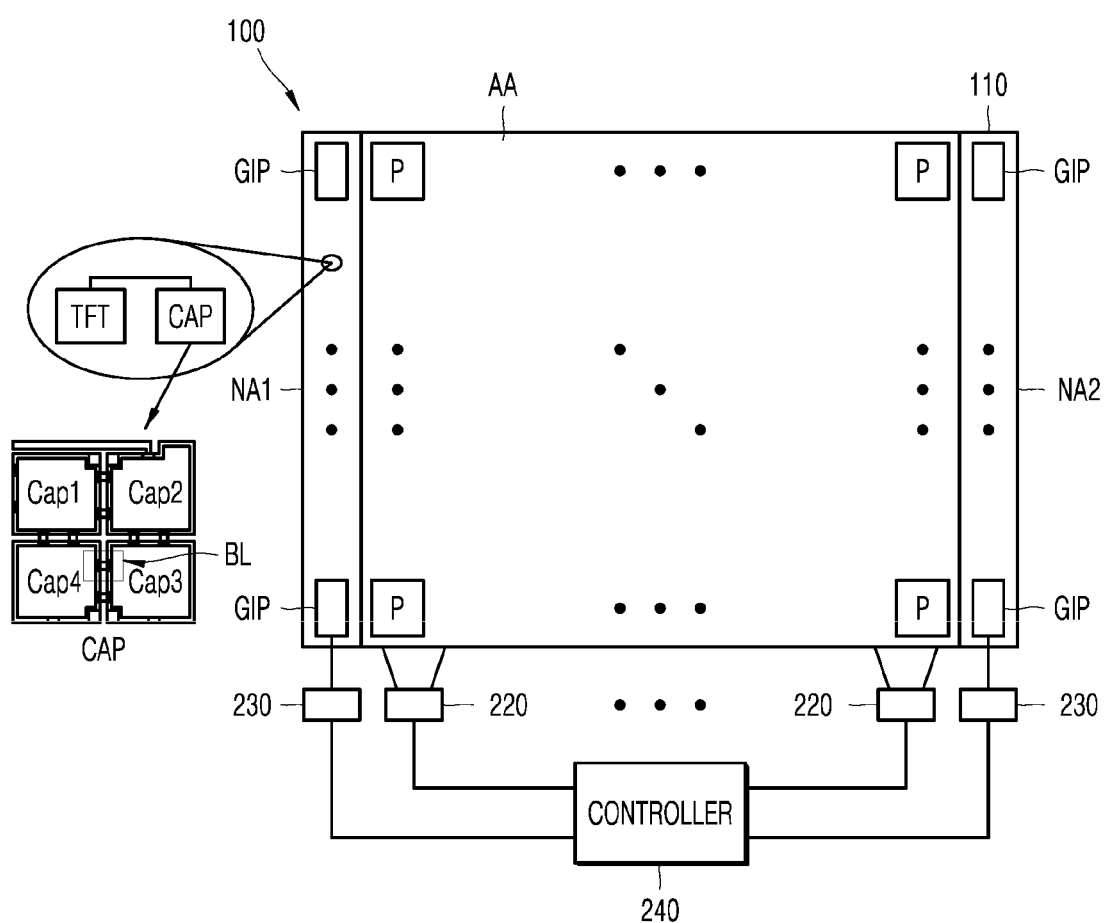
FIG. 1 is a schematic diagram showing an overall configuration of a display device according to an embodiment of the present disclosure.

Advantages and features of the present disclosure, and a method of achieving the Advantages and features will become apparent with reference to embodiments described later in detail together with the accompanying drawings. However, the present disclosure is not limited to the embodiments as disclosed below, but can be implemented in various different forms. Thus, these embodiments are set forth only to make the present disclosure complete, and to completely inform the scope of the disclosure to those of ordinary skill in the technical field to which the present disclosure belongs, and the present disclosure is only defined by the scope of the claims.

A shape, a size, a ratio, an angle, a number, etc. disclosed in the drawings for describing the embodiments of the present disclosure are exemplary, and the present disclosure is not limited thereto. The same reference numerals refer to the same elements herein. Further, descriptions and details of well-known steps and elements are omitted for simplicity of the description. Furthermore, in the following detailed description of the present disclosure, numerous specific details are set forth in order to provide a thorough understanding of the present disclosure. However, it will be understood that the present disclosure can be practiced without these specific details. In other instances, well-known methods, procedures, components, and circuits have not been described in detail so as not to unnecessarily obscure aspects of the present disclosure.

The terminology used herein is for the purpose of describing particular embodiments only and is not intended to be limiting of the present disclosure. As used herein, the singular forms "a" and "an" are intended to include the plural forms as well, unless the context clearly indicates otherwise. It will be further understood that the terms "comprises", "comprising", "includes", and "including" when used in this specification, specify the presence of the stated features, integers, operations, elements, and/or components, but do not preclude the presence or addition of one or more other features, integers, operations, elements, components, and/or portions thereof. As used herein, the term "and/or" includes any and all combinations of one or more of the associated listed items. Expression such as "at least one of" when preceding a list of elements can modify the entire list of elements and can not modify the individual elements of the list. In interpretation of numerical values, an error or tolerance therein can occur even when there is no explicit description thereof.

In addition, it will also be understood that when a first element or layer is referred to as being present "on" a second element or layer, the first element can be disposed directly on the second element or can be disposed indirectly on the second element with a third element or layer being disposed between the first and second elements or layers. It will be understood that when an element or layer is referred to as being "connected to", or "coupled to" another element or layer, it can be directly on, connected to, or coupled to the other element or layer, or one or more intervening elements or layers can be present. In addition, it will also be understood that when an element or layer is referred to as being "between" two elements or layers, it can be the only element or layer between the two elements or layers, or one or more intervening elements or layers can also be present.

Further, as used herein, when a layer, film, region, plate, or the like is disposed "on" or "on a top" of another layer, film, region, plate, or the like, the former can directly contact the latter or still another layer, film, region, plate, or the like can be disposed between the former and the latter. As used herein, when a layer, film, region, plate, or the like is directly disposed "on" or "on a top" of another layer, film, region, plate, or the like, the former directly contacts the latter and still another layer, film, region, plate, or the like is not disposed between the former and the latter. Further, as used herein, when a layer, film, region, plate, or the like is disposed "below" or "under" another layer, film, region, plate, or the like, the former can directly contact the latter or still another layer, film, region, plate, or the like can be disposed between the former and the latter. As used herein, when a layer, film, region, plate, or the like is directly disposed "below" or "under" another layer, film, region, plate, or the like, the former directly contacts the latter and still another layer, film, region, plate, or the like is not disposed between the former and the latter.

In descriptions of temporal relationships, for example, temporal precedent relationships between two events such as "after", "subsequent to", "before", etc., another event can occur therebetween unless "directly after", "directly subsequent" or "directly before" is not indicated.

It will be understood that, although the terms "first", "second", "third", and so on can be used herein to describe various elements, components, regions, layers and/or sections, these elements, components, regions, layers and/or sections should not be limited by these terms. These terms are used to distinguish one element, component, region, layer or section from another element, component, region, layer or section, and may not define order. Thus, a first element, component, region, layer or section described below could be termed a second element, component, region, layer or section, without departing from the spirit and scope of the present disclosure.

The features of the various embodiments of the present disclosure can be partially or entirely combined with each other, and can be technically associated with each other or operate with each other. The embodiments can be implemented independently of each other and can be implemented together in an association relationship.

Unless otherwise defined, all terms including technical and scientific terms used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, a display device and a method for manufacturing the same according to one or more embodiments of the present disclosure will be described. All the components of each display device according to all embodiments of the present disclosure are operatively coupled and configured.

FIG. 1 is a schematic diagram showing an overall configuration of a display device according to an embodiment of the present disclosure.

Referring to FIG. 1, a display device 100 according to an embodiment of the present disclosure includes a display panel 110, a plurality of driver integrated circuits (ICs) 220 and 230, and a controller 240.

In the display panel 110, a display area AA that displays an image can be disposed at a center, and one or more non-display areas NA1 and NA2 that supply signals to the display area AA can be respectively disposed on (both) sides of the display area AA.

In the display area AA, a plurality of data lines and a plurality of gate lines can be arranged to intersect each other, and each pixel P can be disposed at a portion at which each data line and each gate line intersect each other.

The non-display area NA can include a first non-display area NA1 and a second non-display area NA2, each of which includes a plurality of gate-driver in panel (GIP) circuitry GIPs arranged therein. A plurality of GIP circuitry GIPs connected to odd-numbered gate lines among the plurality of gate lines can be arranged in the first non-display area NA1, and a plurality of GIP circuitry GIPs connected to even-numbered gate lines among the plurality of gate lines can be arranged in the second non-display area NA2. However, the connection between the GIP circuitry and the gate line is not limited thereto.

A capacitor area CAP and a transistor area TFT can be disposed in the non-display area NA. The capacitor area CAP includes at least one or more divided capacitors Cap1 to Cap4. The transistor area TFT includes at least one or more thin-film transistors. The source and drain electrodes of each thin film transistor are connected to the respective source and drain metal film S/D of one or more divided capacitors extended from the capacitor area CAP.

In the capacitor area CAP, two neighboring divided capacitors (Cap1, Cap2) or (Cap2, Cap3) or (Cap3, Cap4) or (Cap4, Cap1) of the at least one or more divided capacitors Cap1 to Cap4 can be connected to each other through a bridge line (BL). In other words, in the capacitor area CAP, in a plan view, for example, four neighboring divided capacitors Cap1 to Cap4 are connected to each other through the bridge lines BL.

When the display device 100 according to the present disclosure is applied to a mobile device, as gate signals can be sequentially supplied by the GIP circuitry GIP, widths of the non-display areas NA1 and NA2 of the display panel 110 are narrowed, so that an area of the display area AA can be made larger in the mobile device of the same size.

In the display panel 110, a plurality of gate lines GL and data lines DL are formed in a manner in which each date line and each data line intersect each other on an organic substrate or a plastic substrate, and pixels P corresponding to red R, green G, and blue B are respectively defined at the intersections of the gate lines GL and the data lines DL. Further, a power voltage supply line formed in a direction parallel to the data line DL is further formed on the display panel 110 to be connected to each pixel P.

Further, each of the pixels P includes at least one organic light emitting diode, a capacitor, a switching thin-film transistor, and a driving thin-film transistor. In this connection, the organic light emitting diode can be composed of a first electrode (hole injection electrode), an organic compound layer, and a second electrode (electron injection electrode).

The organic compound layer can further include various organic layers for efficiently transferring carriers of holes or electrons to a light-emitting layer in addition to the light-emitting layer that actually emits light. Such organic layers can be a hole injection layer and a hole transport layer positioned between a first electrode and the light-emitting layer, and an electron injection layer and an electron transport layer positioned between a second electrode and the light-emitting layer.

Further, the switching and driving thin-film transistors are connected to the gate line GL and a control signal supply line CL, and the data line DL. The switching thin-film transistors are conducted based on a gate voltage input to the gate line GL, and at the same time, transmit a data voltage input to the data line DL to the driving thin-film transistor. The capacitor is connected between the thin-film transistor and a power supply line, and is charged with the data voltage transmitted from the thin-film transistor and held for 1 frame.

In addition, the driving thin-film transistor is connected to the power supply line VL and the capacitor, and supplies a drain current corresponding to a gate-source voltage to the organic light emitting diode. Accordingly, the organic light emitting diode emits light by the drain current. In this connection, the driving thin-film transistor includes a gate electrode, a source electrode, and a drain electrode, and an anode electrode of the organic light emitting diode is connected to one electrode of the driving thin-film transistor.

In FIG. 1, a plurality of driver ICs 220 and 230 can include a driver IC 220 connected to the data line to drive the data signal and a driver IC 230 connected to the GIP circuitry GIP to drive the GIP circuitry GIP. The number of driver ICs 220 driving the data signals can correspond to a resolution and/or a size of the display area AA. When the GIP circuitry GIPs arranged in the first non-display area NA1 and the second non-display area NA2 are driven by the driver ICs driving the gate signals, the plurality of GIP circuitry GIPs can sequentially supply the gate signals to the gate lines.

The GIP circuitry GIP includes a gate driver of a GIP structure. In this connection, the gate driver can be formed as a bottom gate-type thin-film transistor BG-T, the source and drain metal film S/D of the bridge line BL can be extended and connected to the drain electrode of the thin-film transistor BG-T, and a gate metal film of the bridge line BL can be extended and connected to the gate electrode of the thin-film transistor BG-T.

Further, the source and drain metal film S/D of the bridge line BL can extend from each divided capacitor Cap1 to Cap4, and be connected to the source and drain electrode of the switching thin-film transistor Tsw or the sensing thin-film transistor Tss disposed in the transistor area TFT.

The controller 240 can output control signals that control the plurality of driver ICs 220 and 230. Further, the controller 240 can supply an image signal to the driver IC 220 driving the data line among the plurality of driver ICs 220 and 230.

Further, the controller 240 can receive an input signal from an external device. The external device can be a keyboard, a mouse, or a touch panel. However, it is not limited thereto. The controller 240 can drive the display panel 110 in a normal mode or a low power mode in response to the input signal.

Figure 2:
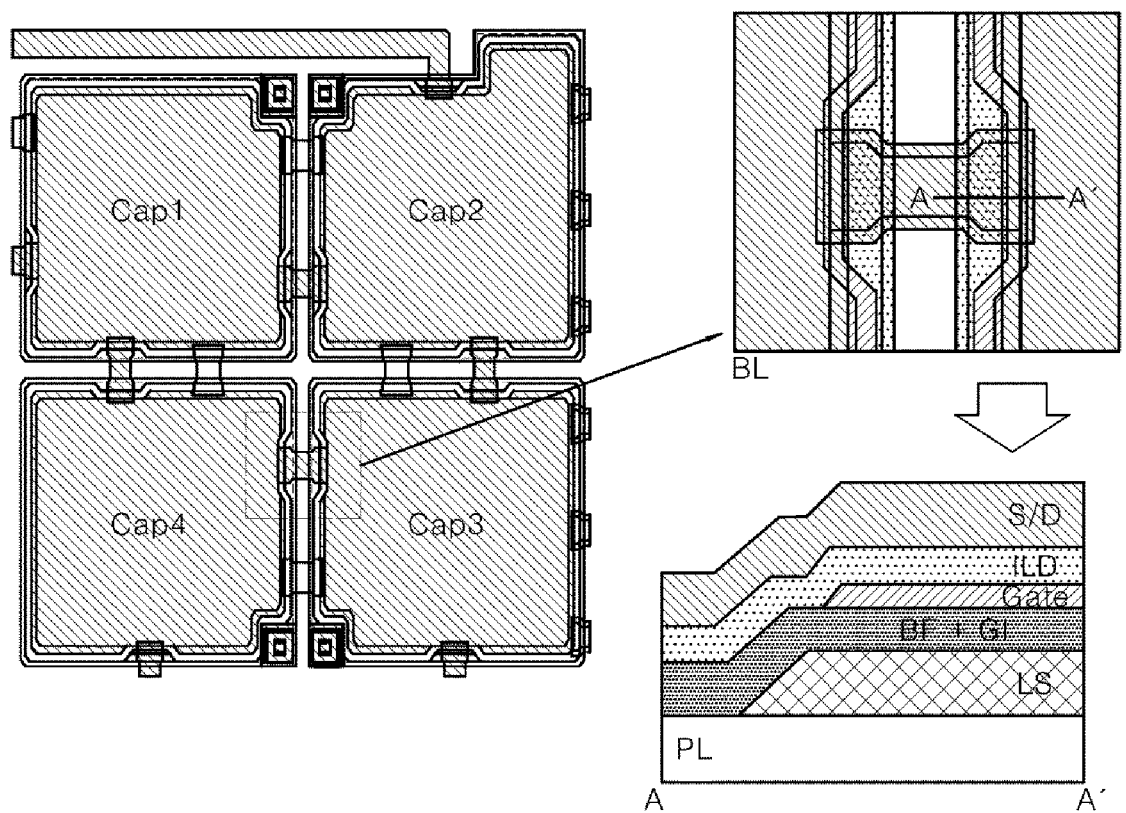
FIG. 2 is a diagram showing a structure of a capacitor area and a cross-section of a bridge line in a display device according to an embodiment of the present disclosure.
Figure 3:
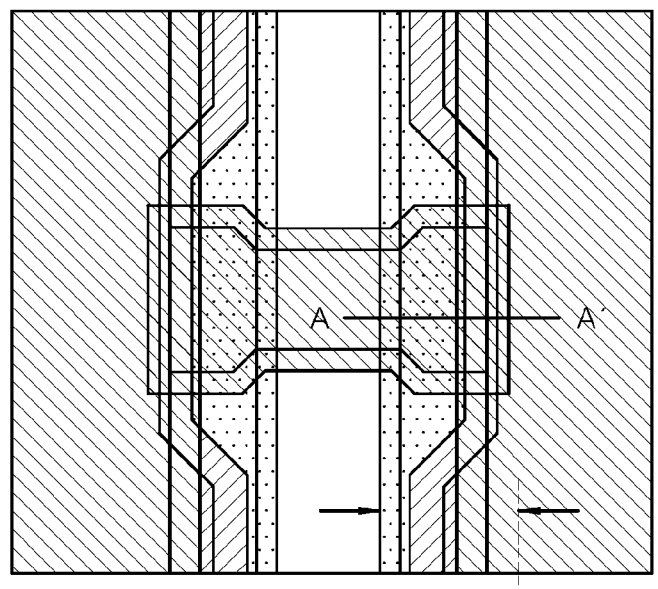
FIG. 3 is a diagram showing an interlayer overlay margin of a bridge line connecting two divided capacitors in a capacitor area of a display device according to an embodiment of the present disclosure.
Figure 3:
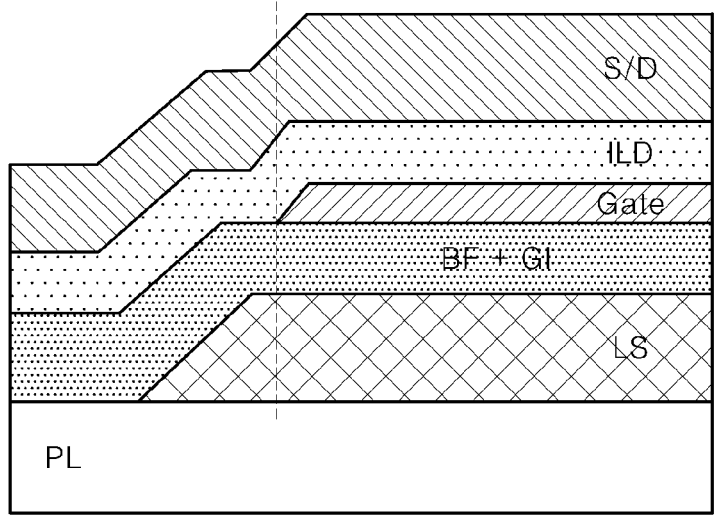

FIG. 2 is a diagram showing a structure of a capacitor area and a cross-section of a bridge line in a display device according to an embodiment of the present disclosure, and FIG. 3 is a diagram showing an interlayer overlay margin of a bridge line connecting two divided capacitors in a capacitor area of a display device according to an embodiment of the present disclosure. Particularly, the top right drawing in FIG. 2 shows an enlarged area of the left drawing of FIG. 2, and the bottom right drawing in FIG. 2 is a cross-sectional view along line A-A' in the top right drawing of FIG. 2.

Referring to FIG. 2 and FIG. 3, in the capacitor area CAP disposed in the non-display area NA of the display device 100 according to an embodiment of the present disclosure, for example, a first divided capacitor Cap1, a second divided capacitor Cap2, a third divided capacitor Cap3, and a fourth divided capacitor Cap4 are adjacent to each other and are connected to each other through the bridge lines BL. For example, the first divided capacitor Cap1 and the second divided capacitor Cap2 adjacent to each other are connected to each other through a first bridge line BL1, the second divided capacitor Cap2 and the third divided capacitor Cap3 are connected to each other through a second bridge line BL2, the third divided capacitor Cap3 and the fourth divided capacitor Cap4 are connected to each other through a third bridge line BL3, and the fourth divided capacitor Cap4 and the first divided capacitor Cap1 are connected to each other through a fourth bridge line BL4.

In a cross-sectional structure of the non-display area NA, a light-blocking film LS is disposed on a top face of the substrate PL to expose a portion of the substrate, a buffer BF and a gate insulating film GI are placed on top faces of the exposed substrate and the light-blocking film, the gate metal film Gate exposing a portion of the buffer and gate insulating film BF+GI is disposed on a top face of the buffer and gate insulating film, an interlayer insulating film ILD is placed on a top face of the exposed buffer and gate insulating film and a top face of the gate metal film, and the source and drain metal film S/D is disposed on a top face of the interlayer insulating film.

In this connection, the source and drain metal film S/D forms the bridge line BL that connects the two neighboring divided capacitors (e.g., Cap1 to Cap2) among the at least one or more divided capacitors Cap1 to Cap4 disposed in the non-display area NA of the display panel 110.

In this connection, the buffer and gate insulating film BF+GI can include a bent first region A1 and a flat second region A2 (e.g., see FIG. 8), and the gate metal film gate can be formed in the second region A2 so as not to reach the first region A1 on top face of the buffer and gate insulating film BF+GI.

Further, the two neighboring divided capacitors in the four divided capacitors Cap1 to Cap4 are connected to each other through the bridge line BL. In a plan view, a spaced region between adjacent two divided capacitors is divided into a bridge line region in which the adjacent two divided capacitors is connected to each other through the bridge line, and a bridge line free region, wherein a spacing between the adjacent two divided capacitors is larger in the bridge line region than in the bridge line free region.

Further, in the bridge line BL, the gate metal film Gate can be formed by a photoresist PR having a patterned portion of a smaller width than the second region A-2 of the buffer and gate insulating film BF+GI.

As shown in FIG. 3, an interlayer overlay margin of the bridge line BL connecting the two divided capacitors with each other in the capacitor area CAP of the display device 100 is a spacing d from an end of the light-blocking film LS to an end of the gate metal film Gate. The gate metal film Gate can be formed such that the spacing d is equal to or greater than 2 μm and equal to or less than 6.0 μm. In this connection, it can be desirable that the interlayer overlay margin of the bridge line BL is approximately 6.0 μm.

Figure 4:
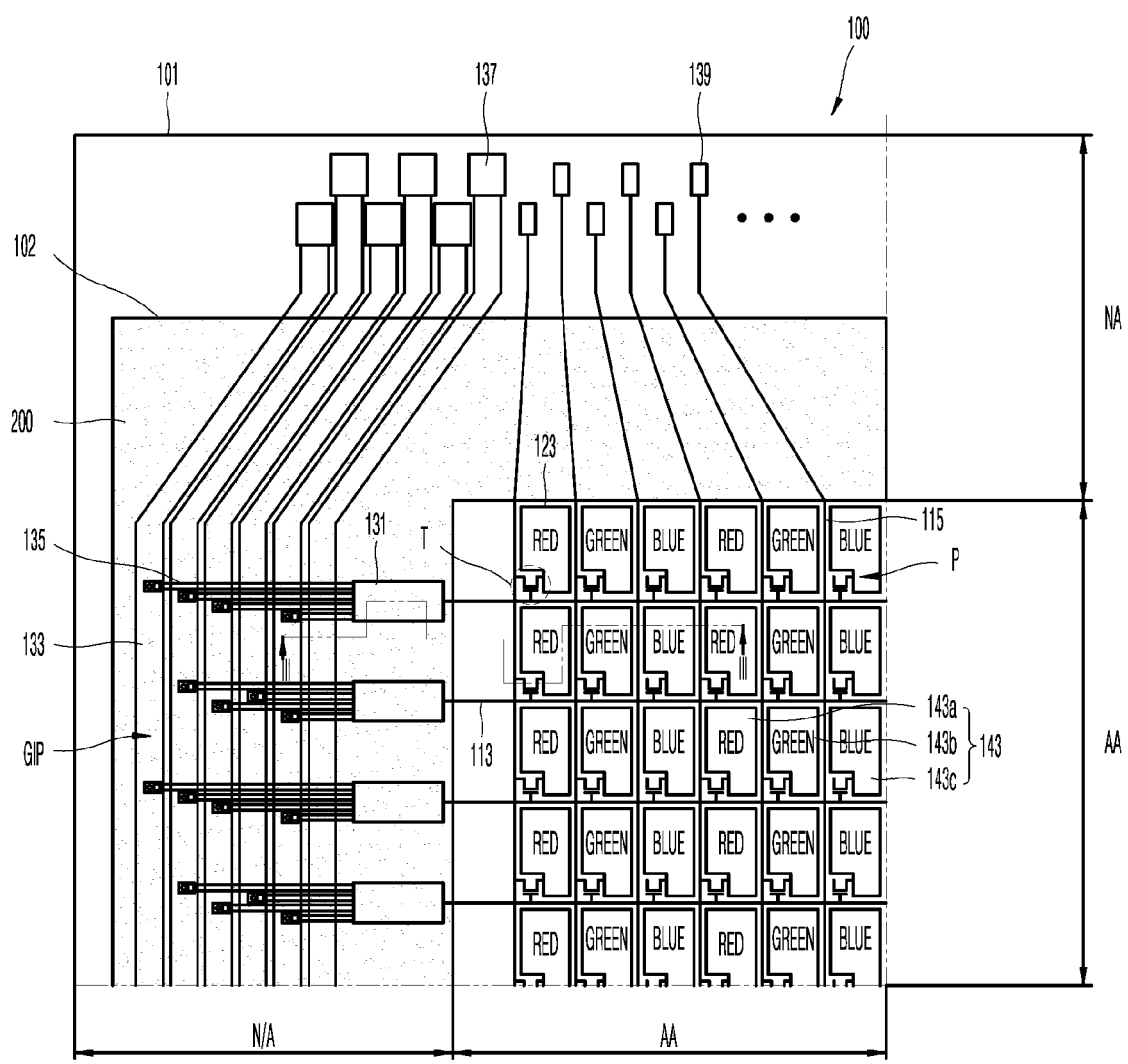
FIG. 4 is a plan view schematically showing partial structures of a display area and a non-display area of a display device according to an embodiment of the present disclosure.

FIG. 4 is a plan view schematically showing partial structures of a display area and a non-display area of a display device according to an embodiment of the present disclosure.

Referring to FIG. 4, in the display device 100 according to the embodiment of the present disclosure, a lower first substrate 101 and an upper second substrate 102 face each other with a light-emitting layer interposed therebetween. The first substrate 101 and the second substrate 102 are spaced apart from each other, and sealed and bonded with each other through a seal pattern 200 at edge portions thereof.

In this connection, the GIP-type display device 100 is defined as the display area AA in which the image is displayed and the non-display area NA surrounding the display area AA. Under the premise of an active matrix method, a number of gate wires (lines) GL and data wires (lines) DL intersect with each other on an inner surface of the display area AA of the first substrate 101 to define the pixels P, and a transparent pixel electrode 123 is formed in each pixel P.

Further, a thin-film transistor T, which is a switching element, is disposed at the intersection of each gate wire GL and each data wire DL.

In this connection, in the non-display area NA on one side of the first substrate 101, gate pads 137 respectively connected to the gate wires GL and data pads 139 respectively connected to the data wires DL are formed, so that the gate and data wires GL and DL are connected to an external printed circuit board.

In the non-display area NA, the GIP circuitry GIP including a number of gate circuit blocks 131 and a number of first and second connection wires 133 and 135 is configured.

On an inner surface of the second substrate 102, a color filter layer 143 including color filters 143a, 143b, and 143c respectively corresponding to the pixels P, for example, of red R, green G, and blue B, and a black matrix surrounding the color filters and disposed at a position corresponding to the non-display area NA, such as the gate wire GL, the data wire DL, and the thin-film transistor T, are arranged.

For example, the black matrix is formed to separate the pixels P within the display area AA, and is in a form of capturing the display area AA along an edge of the display area AA, which is the non-display area NA.

A transparent common electrode 145 covering them is disposed on the second substrate 102.

A sealant is applied to an edge of the non-display area NA of the first substrate 101 and the second substrate 102 to prevent leakage of the light-emitting layer. The sealant is a polymer mixture in which an epoxy resin, a curing accelerator, and the like are mixed with each other, and is cured by heating or UV irradiation to form the seal pattern 200 serving as an adhesive that maintains the bonded state of the two substrates 101 and 102. For example, the seal pattern 200 is formed in the non-display area NA surrounding the edge of the display area AA.

In this connection, in the GIP-type display device 100 according to an embodiment of the present disclosure, a dummy color filter composed of at least one of the red, green, and blue color filters 143a, 143b, and 143c is located along the non-display area NA of the second substrate 102. The seal pattern 200 is located between the GIP circuitry GIP including the number of gate circuit blocks 131 of the first substrate 101 and the number of first and second connection wires 133 and 135, and the dummy color filter DCF.

A dummy spacer DS is located on a top face of the dummy color filter DCF. The dummy spacer DS is located within the seal pattern 200. Through the dummy spacer DS and the dummy color filter DCF, the seal pattern 200 can implement a vertical level corresponding to a spacing between the first and second substrates 101 and 102.

Figure 5:
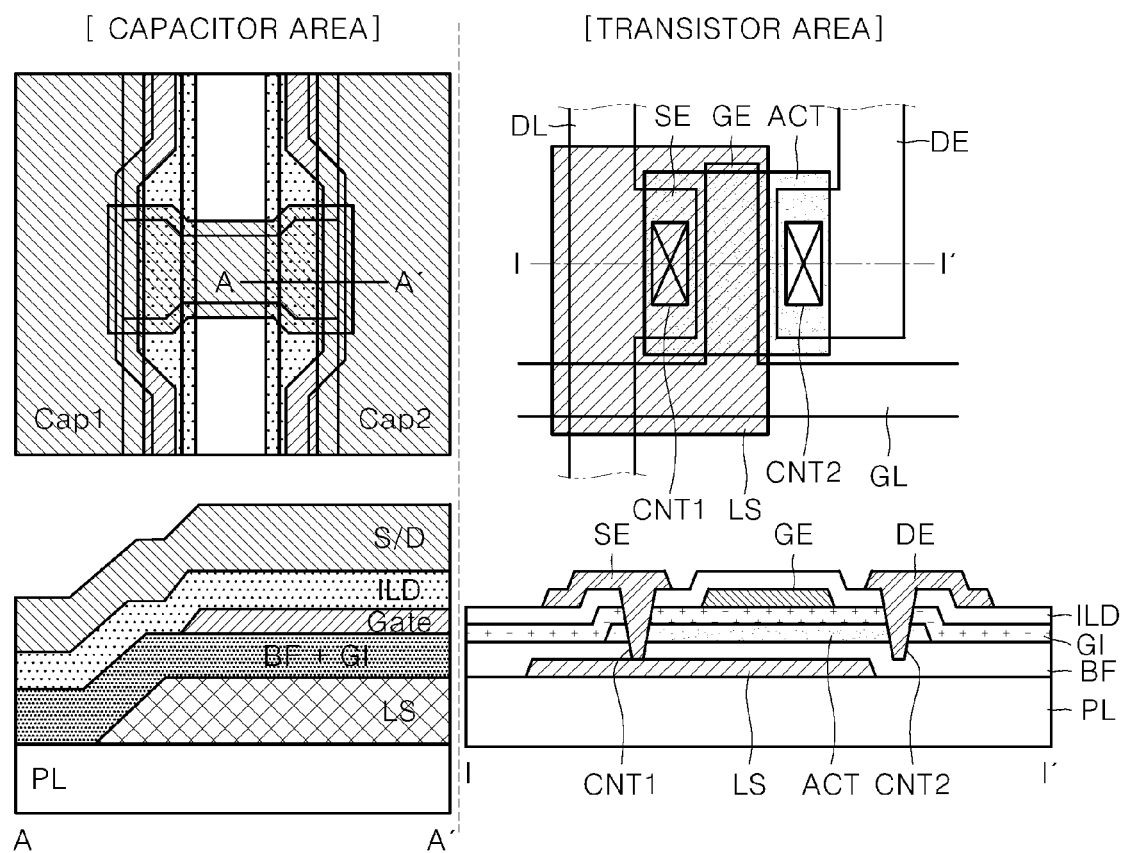
FIG. 5 is a view showing structures of a capacitor area and a transistor area of a display device according to an embodiment of the present disclosure.
Figure 6:
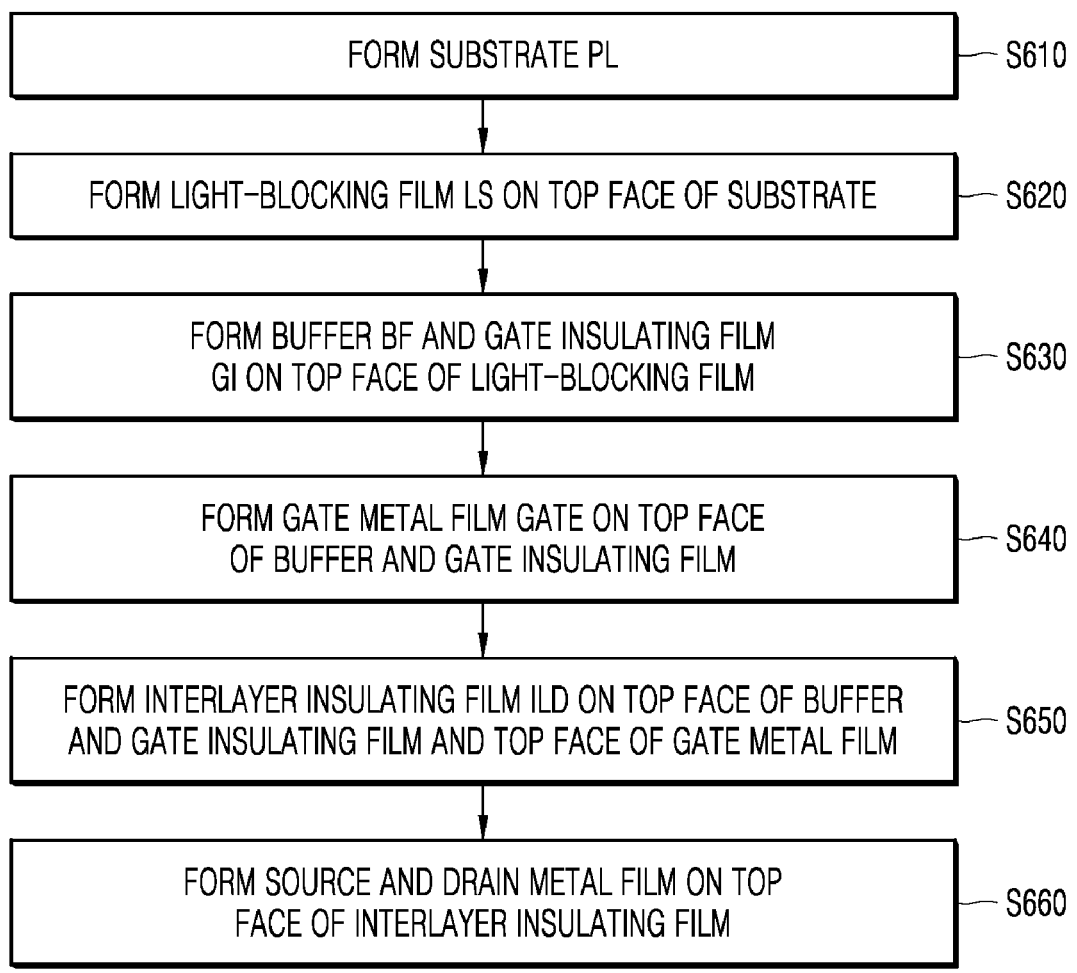
FIG. 6 to FIG. 12 are views showing a process of forming a bridge line in a display device manufacturing method according to an embodiment of the present disclosure.

FIG. 5 is a diagram showing structures of a capacitor area and a transistor area of a display device according to an embodiment of the present disclosure. For example, in FIG. 5, the left top drawing shows an example of the capacitor area while the left bottom drawing shows a cross-sectional view along line A-A' in the left top drawing. Further, in FIG. 5, the right top drawing shows an example of the transistor area while the right bottom drawing shows a cross-sectional view along line I-I' in the right top drawing.

Referring to the left drawings of FIG. 5, in the capacitor area CAP of the display device 100 according to an embodiment of the present disclosure, the source and drain metal film S/D of the bridge line BL connecting the two divided capacitors Cap1 and Cap2 with each other can operate as the first electrode of the capacitor, and the gate metal film gate having the interlayer insulating layer ILD between itself and the source and drain metal film S/D can act as the second electrode of the capacitor.

In one example, referring to the right drawings of FIG. 5, in the transistor area TFT, the thin-film transistor T defines the pixel in the display area AA of the substrate PL by vertically intersecting the gate line GL and the data line DL, each of which is formed in one direction on the substrate PL. The thin-film transistor is formed at the intersection of the gate line GL and the data line DL. Further, a pixel electrode connected to an upper thin-film transistor through a contact hole can be formed.

The thin-film transistor T includes an active layer ACT, a gate electrode GE branched from the gate line GL and overlapping with the active layer ACT, a source electrode SE branched from the data wire DL, and a drain electrode DE spaced a certain distance apart from the source electrode SE. In this connection, the source electrode SE and the drain electrode DE are formed to contact the active layer ACT via a first contact hole CNT1 and a second contact hole CNT2, respectively.

The light-blocking film LS is formed at a lower portion of the thin-film transistor T. More specifically, the light-blocking film LS is formed at a portion beneath an area including the gate electrode GE and the source electrode SE of the thin-film transistor. Further, the light-blocking film LS is formed to be exposed via the first contact hole CNT1, and formed to contact the source electrode SE via the first contact hole CNT1. The second contact hole CNT2 and the light-blocking film LS are formed to be spaced apart from each other. Therefore, the drain electrode DE formed in the second contact hole CNT2 is not in contact with the light-blocking film LS.

FIG. 5 shows that the light-blocking film LS is formed only in the portion beneath the area including the gate electrode GE and the source electrode SE of the thin-film transistor, but the present disclosure is not limited thereto. For example, the light-blocking film LS can be formed on an entirety of a top face of the substrate PL, and have a hole defined therein at a position beneath an area where the drain electrode DE is formed.

The first contact hole CNT1 and the second contact hole CNT2 are defined by etching the buffer layer BF, the active layer ACT, the gate insulating film GI, and the interlayer insulating film ILD sequentially stacked. In this connection, the first contact hole CNT1 is defined to reach the light-blocking film LS to expose the light-blocking film LS. On the other hand, the second contact hole CNT2 is defined at an area where the light-blocking film LS is not formed, and is defined to be spaced apart from the light-blocking film LS so as not to expose the light-blocking film LS.

The source electrode SE is formed in the first contact hole CNT1, and the drain electrode DE is formed in the second contact hole CNT2. Thus, only the source electrode SE can be in contact with the light-blocking film LS via the first contact hole CNT1. Further, because the first contact hole CNT1 and the second contact hole CNT2 penetrate the active layer ACT, the first contact hole CNT1 and the second contact hole CNT2 expose side surfaces of the active layer ACT. Thus, the source electrode SE and the drain electrode DE are formed to be in contact with the exposed side surfaces of the active layer ACT.

The drawing is illustrated by simplifying the thin-film transistor according to the present disclosure, but the present disclosure is not limited thereto. A shape of each component including the light-blocking film LS can be various within the scope of the technical idea of the present disclosure. Further, although one thin-film transistor is shown in the drawing, a number of thin-film transistors can be included in the pixel.

The number of thin-film transistors can be the driving thin-film transistors, the sensing thin-film transistors, or the switching thin-film transistors. The light-blocking film LS can be formed at the lower portion of at least one thin-film transistor.

FIGS. 6 to 12 are diagrams showing a process of forming a bridge line in a display device manufacturing method according to an embodiment of the present disclosure.

Figure 7:
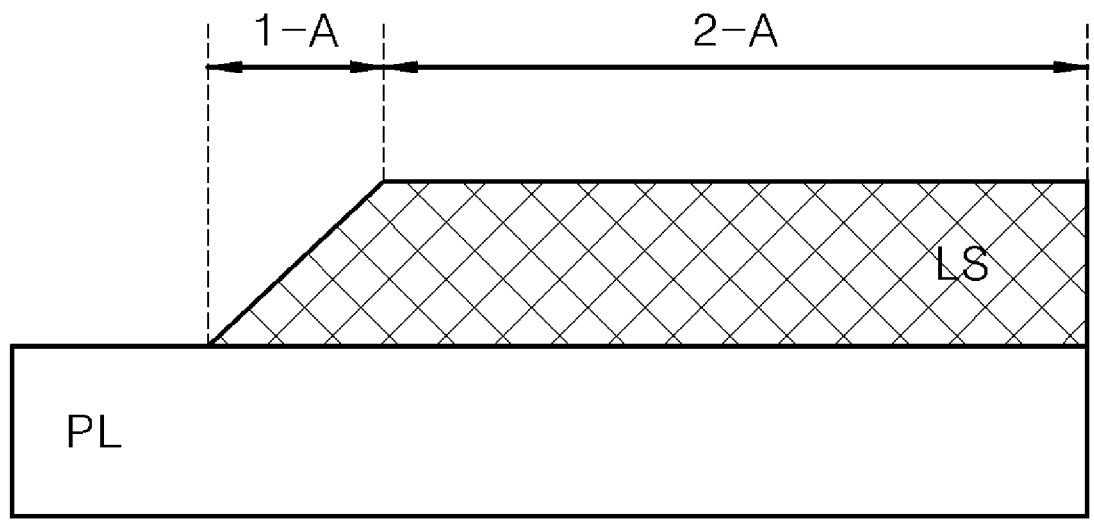

Referring to FIGS. 6 to 12, in the non-display area NA including the transistor area TFT and the capacitor area CAP of the display device 100 according to an embodiment of the present disclosure, first the substrate PL is formed (S610), and then, the light-blocking film LS is formed on the top face of the substrate such that a portion of the substrate is exposed (S620) as shown in FIG. 7.

More specifically, a light-shielding metal layer is formed on the top face of the substrate PL, and the photoresist PR is formed on a top face of the light-shielding metal layer. Thereafter, a photoresist pattern is formed by exposure and development processes using a mask composed of a transmissive portion and a blocking portion. The light-blocking film LS is formed by etching the light-shielding metal layer using the photoresist pattern as a mask.

In this connection, the light-blocking film LS formed on the top face of the substrate has a stepped first region 1-A and a flat second region 2-A as shown in FIG. 7. The substrate PL can be made of glass, plastic, or the like as an insulating substrate. Further, the light-blocking film LS can be made of a non-transparent metal material. For example, the light-blocking film LS can be made of at least one conductive metal selected from a group consisting of aluminum (Al), tungsten (W), copper (Cu), molybdenum (Mo), chromium (Cr), titanium (Ti), moly-tungsten (MoW), molytanium (MoTi), and copper/moly-tanium (Cu/MoTi). However, the present disclosure is not limited thereto, and any material that can block light can be used.

Figure 8:
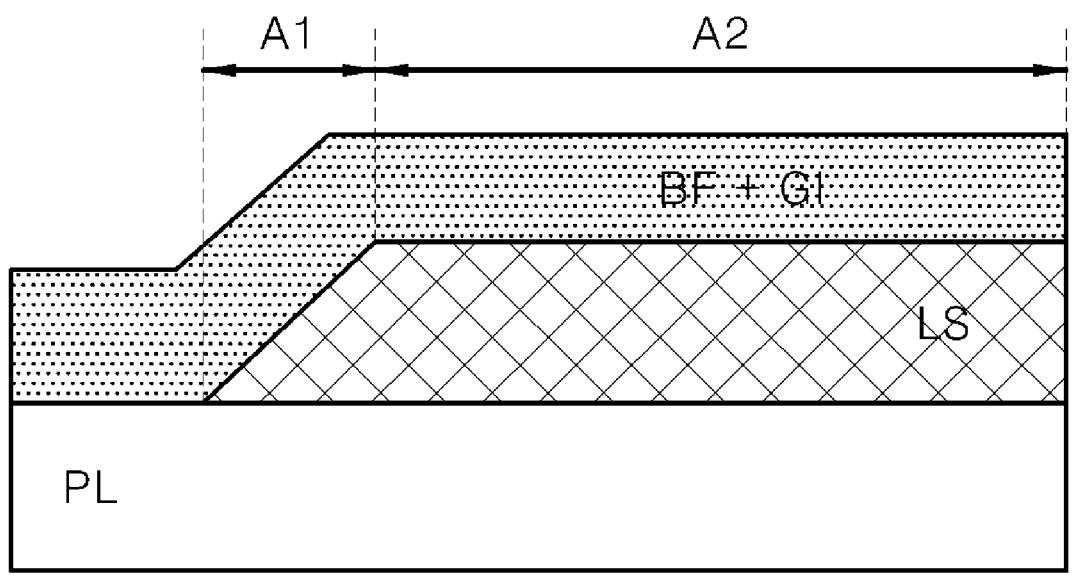

Then, the buffer BF and the gate insulating film GI are formed on a top face of the exposed substrate and a top face of the light-blocking film (S630) as shown in FIG. 8.

For example, the buffer layer BF is first formed on the entirety of the top face of the substrate PL on which the light-blocking film LS is formed, and the gate insulating film GI is formed on a top face of the buffer layer BF. In this connection, the buffer layer BF and the gate insulating film GI can have flat surfaces.

The gate insulating film GI can be made of a dielectric such as $SiO_x$, $SiN_x$, SiON, $HfO_2$, $Al_2O_3$, $Y_2O_3$, $Ta_2O_5$, and the like, a high-k dielectric, or combinations thereof. However, the present disclosure is not limited thereto. The gate insulating film GI is formed as a single layer in the drawing, but can be formed as a multiple layers composed of two or more layers.

In this connection, the buffer and gate insulating film BF+GI formed on the top face of the portion of the substrate PL and the top face of the light-blocking film LS have a bent first region A1 and a flat second region A2 as shown in FIG. 8.

Figure 9:
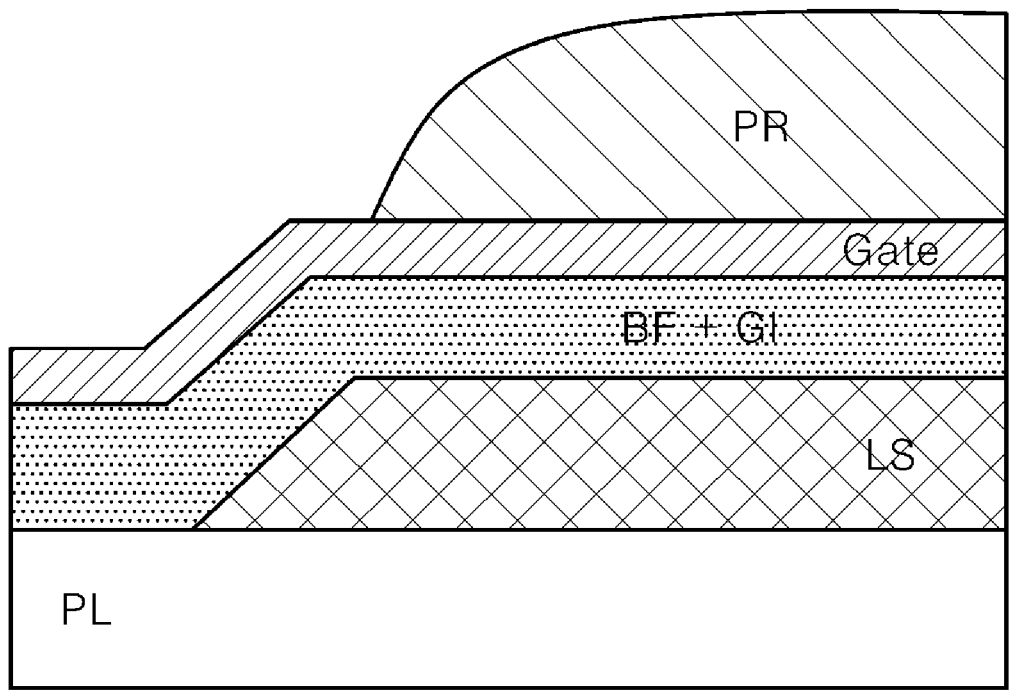
Figure 10:
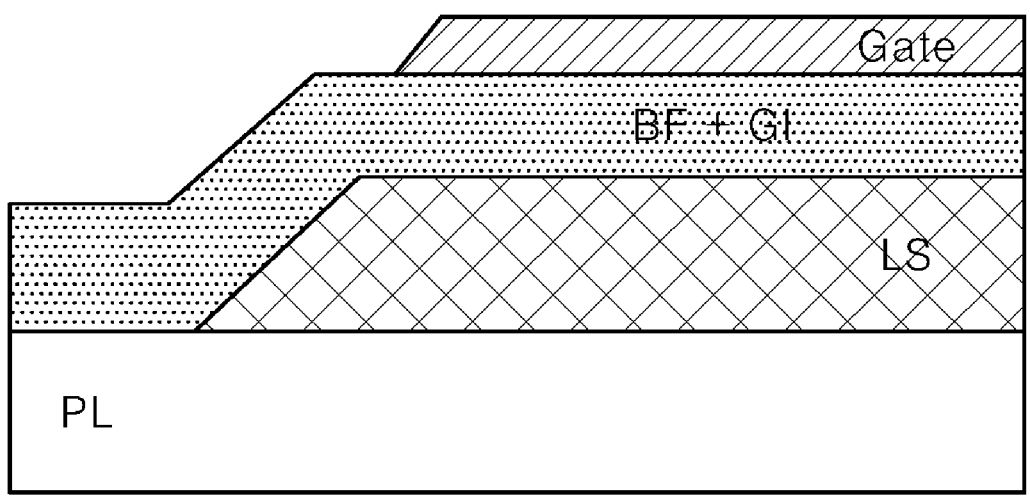

Then, the gate metal film Gate is formed on the top face of the buffer and gate insulating film BF+GI such that a portion of the buffer and gate insulating film is exposed (S640) as shown in FIGS. 9 and 10.

For example, the gate metal film Gate is formed on the top face of the buffer and gate insulating film BF+GI in the second region A2 so as not to reach the first region A1.

In this connection, the gate metal film Gate can be formed by a mask process using the photoresist PR as shown in FIG. 9. In this connection, the photoresist PR has a patterned portion with a width smaller than that of the second region 2-A of the light-blocking film LS. The light-blocking film LS has the stepped first region 1-A and the flat second region 2-A. Therefore, the gate metal film Gate is formed to have the width smaller than that of the second region A-2 of the light-blocking film LS by the patterned portion of the photoresist PR.

The gate metal film Gate can be made of a non-transparent metal material, for example, at least one selected from a conductive metal group consisting of aluminum (Al), tungsten (W), copper (Cu), molybdenum (Mo), chromium (Cr), tantalum (Ta), titanium (Ti), and alloys formed from combinations thereof, but the present disclosure may not be limited thereto.

Figure 11:
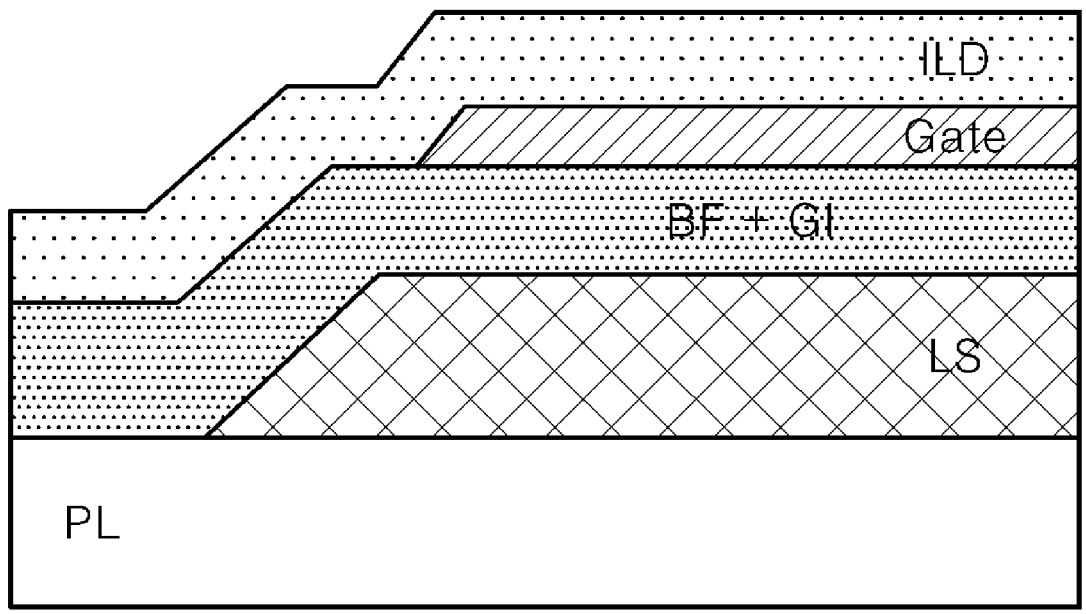

Then, the interlayer insulating film ILD is formed on a top face of the exposed buffer and gate insulating film BF+GI and a top face of the gate metal film (S650) as shown in FIG. 11.

Figure 12:
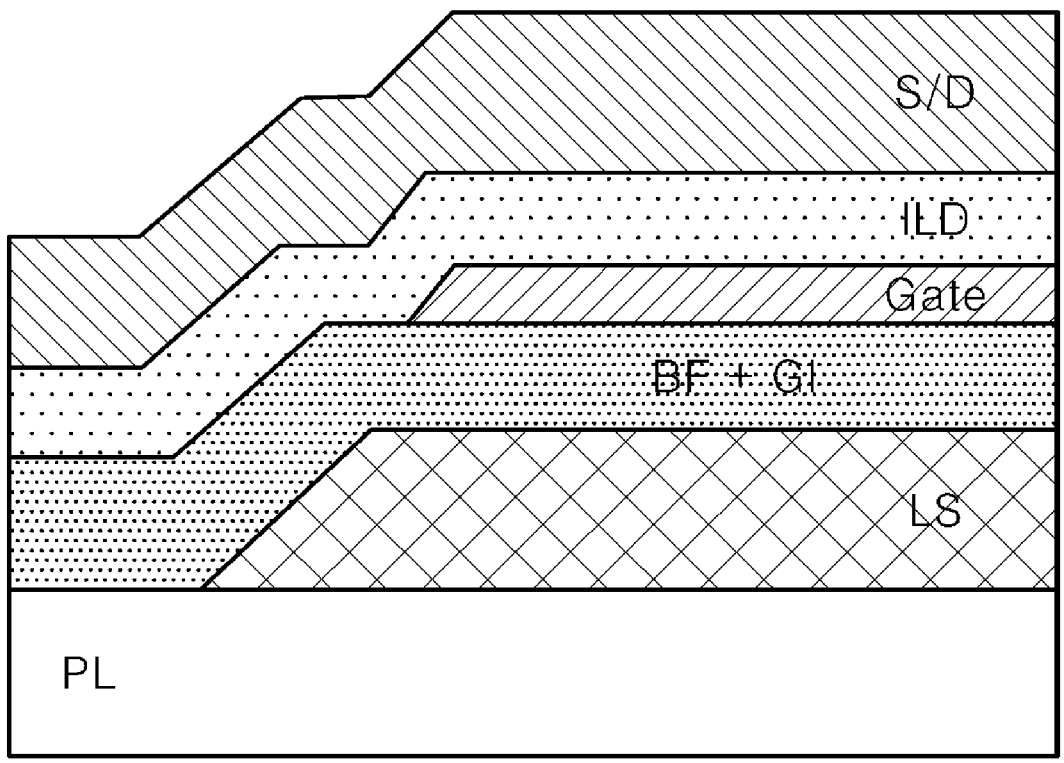

Then, as shown in FIG. 12, the source and drain metal film S/D is formed on the top face of the interlayer insulating film ILD (S660).

In this connection, the source and drain metal film S/D can be formed using one of molybdenum (Mo), titanium (Ti), tantalum (Ta), tungsten (W), copper (Cu), chromium (Cr), aluminum (Al), and alloys formed from combinations thereof. Further, a transparent conductive material such as indium tin oxide (ITO) can be used. However, the present disclosure may not be limited thereto, and the source and drain metal film S/D can be made of a material that can be generally used as an electrode.

In this connection, the source and drain metal film S/D can form the bridge line BL connecting the two neighboring divided capacitors with each other, and can extend from the bridge line to be connected to the source and drain electrode of each of the sensing thin-film transistor and the switching thin-film transistor.

The display device 100 according to an embodiment of the present disclosure having the above-described structure and process can be applied to a sensing GIP capacitor in an OLED 8K TV.

Further, the bridge line BL according to an embodiment of the present disclosure can be applied not only to a structure that connects the neighboring divided capacitors with each other in the capacitor area CAP of the display device 100 as described above, but also to a structure that connects neighboring divided capacitors in an antistatic (ESD) circuit of the display device 100 without being limited to the embodiment. For example, the source and drain metal film S/D according to the present disclosure can form a bridge line connecting two neighboring divided capacitors among at least one divided capacitor with each other in the antistatic (ESD) circuit.

As described above, according to the present disclosure, the display device and the method for manufacturing the same that allow the two divided capacitors to be connected to each other through the bridge line in the capacitor area including the at least one divided capacitor can be implemented.

In addition, in the display device according to the present disclosure, for the bridge line that connects the neighboring divided capacitors with each other in the capacitor area including the at least one divided capacitor in the non-display area of the display panel, the source and drain metal is disposed at the top layer to connect the neighboring divided capacitors with each other, and the gate metal is located at the lower layer with the insulating layer interposed therebetween, and disposed to be spaced by a certain spacing apart from the source and drain metal such that leakage from the source and drain metal does not occur on the buffer and gate metal film.

Further, according to the present disclosure, as the process of forming the bridge line BL that connects the two divided capacitors of the capacitor area in the non-display area of the display panel, the light-blocking film LS is formed on the top face of the substrate PL, the buffer and gate insulating film BF+GI is formed on the top face of the light-blocking film, the gate metal film is formed on the top face of the buffer and gate insulating film, the interlayer insulating film ILD is formed on the top face of the gate metal film, and the source and drain metal film S/D is formed on the top face of the interlayer insulating film, so that the process of forming the bridge line BL with the source and drain metal film S/D at the top layer can be realized.

Although the embodiments of the present disclosure have been described in more detail with reference to the accompanying drawings, the present disclosure is not necessarily limited to these embodiments. The present disclosure can be implemented in various modified manners within the scope not departing from the technical idea of the present disclosure. Accordingly, the embodiments disclosed in the present disclosure are not intended to limit the technical idea of the present disclosure, but to describe the present disclosure. The scope of the technical idea of the present disclosure is not limited by the embodiments. Therefore, it should be understood that the embodiments as described above are illustrative and non-limiting in all respects. The scope of protection of the present disclosure should be interpreted by the claims, and all technical ideas within the scope of the present disclosure should be interpreted as being included in the scope of the present disclosure.

What is claimed is:

1. A display device comprising:
    a display panel including a display area and a non-display-area; area,
    wherein the non-display area includes a capacitor area and a transistor area,
    wherein the capacitor area includes at least two or more divided capacitors, and the transistor area includes at least one or more thin-film transistors,
    wherein in the capacitor area, two divided capacitors of the at least two or more divided capacitors are adjacent to each other and are connected to each other through a bridge line, and
    wherein the bridge line is extended from each divided capacitor of the two divided capacitors and includes a gate metal film connected to a gate electrode of each thin-film transistor of the at least one or more thin-film transistors disposed in the transistor area. at least one thin film transistor disposed in the non display area.

2. The display device of claim 1, wherein the non-display area includes:
    a light-blocking film disposed on a substrate;
    a buffer and gate insulating film disposed on the light-blocking film;
    the gate metal film disposed on the buffer and gate insulating film;
    an interlayer insulating film disposed on the buffer and gate insulating film and the gate metal film; and
    a source and drain metal film disposed on the interlayer insulating film.

3. The display device of claim 2, wherein the buffer and gate insulating film includes a bent first region and a flat second region, and
    wherein the gate metal film is disposed in the flat second region on the buffer and gate insulating film so as not to reach the bent first region.

4. The display device of claim 3, wherein the gate metal film is formed by a photoresist having a patterned portion having a smaller width than the flat second region of the buffer and gate insulating film.

5. The display device of claim 1, wherein in a plan view, neighboring divided capacitors among 4 divided capacitors of the at least two or more divided capacitors are connected to each other through the bridge line in the capacitor area.

6. The display device of claim 1, wherein in a plan view, a distance between the two divided capacitors connected to each other through the bridge line is larger in a portion connected through the bridge line than in another portion.

7. The display device of claim 1, wherein a plurality of gate-driver in panel (GIP) circuitry are arranged in the non-display area.

8. The display device of claim 7, wherein the non-display area includes a first non-display area and a second non-display area, and each of the first non-display area and the second non-display area includes the plurality of GIP circuitry arranged therein.

9. The display device of claim 8, wherein a first plurality of GIP circuitry respectively connected to odd-numbered gate lines among a plurality of gate lines are arranged in the first non-display area, and
    wherein a second plurality of GIP circuitry respectively connected to even-numbered gate lines among the plurality of gate lines are arranged in the second non-display area.

10. The display device of claim 7, wherein the GIP circuitry includes a gate driver of a GIP structure,
    wherein the gate driver is disposed as a bottom gate-type thin-film transistor, and
    wherein the gate metal film is extended and connected to a gate electrode of the bottom gate-type thin-film transistor.

* * * * *